(12) United States Patent
Shafiee Ardestani et al.

(10) Patent No.: US 10,090,030 B1
(45) Date of Patent: Oct. 2, 2018

(54) SIGNAL CONVERSION USING AN ANALOG-TO-DIGITAL CONVERTER AND REFERENCE VOLTAGE COMPARISON

(71) Applicant: Hewlett Packard Enterprise Development LP, Houston, TX (US)

(72) Inventors: Ali Shafiee Ardestani, Palo Alto, CA (US); Naveen Muralimanohar, Santa Clara, CA (US); Brent Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/581,159

(22) Filed: Apr. 28, 2017

(51) Int. Cl.
G11C 7/16 (2006.01)
G11C 7/22 (2006.01)
H03M 1/34 (2006.01)
H03K 21/02 (2006.01)
H03M 1/66 (2006.01)

(52) U.S. Cl.
CPC .............. *G11C 7/22* (2013.01); *H03K 21/02* (2013.01); *H03M 1/34* (2013.01); *H03M 1/66* (2013.01)

(58) Field of Classification Search
CPC .. G11C 7/22; G11C 7/16; H03M 1/66; H03M 1/34; H03K 21/02
See application file for complete search history.

(56) References Cited

U.S. PATENT DOCUMENTS

| | | | |
|---|---|---|---|
| 4,325,055 A | 4/1982 | Colardelle et al. | |
| 5,877,715 A * | 3/1999 | Gowda | H03M 1/1023 341/118 |
| 6,525,304 B1 | 2/2003 | Merrill et al. | |
| 6,545,624 B2 | 4/2003 | Lee et al. | |
| 6,573,852 B2 | 6/2003 | Knapp | |
| 7,623,173 B2 * | 11/2009 | Nitta | H03M 1/1023 348/297 |
| 7,804,535 B2 * | 9/2010 | Muramatsu | H04N 9/083 348/273 |
| 7,830,292 B2 | 11/2010 | Kirsch | |
| 8,730,364 B2 | 5/2014 | Dai et al. | |
| 2006/0165199 A1 * | 7/2006 | Takemoto | H04B 7/0865 375/347 |
| 2007/0080376 A1 * | 4/2007 | Adachi | H04N 5/3598 257/239 |
| 2010/0053399 A1 * | 3/2010 | Nishi | H03M 1/123 348/308 |

\* cited by examiner

*Primary Examiner* — Khamdan Alrobaie
(74) *Attorney, Agent, or Firm* — Hewlett Packard Enterprise Patent Department

(57) ABSTRACT

Examples disclosed herein relate to a circuit having first and second analog processors and an analog-to-digital converter coupled to the first and second analog processors. The first analog processor provides a first analog signal having a voltage representing a function of a first vector and a second vector. The second analog processor provides a second analog signal having a voltage representing a function of a binary inverse of the first vector and the second vector. The analog-to-digital converter receives the first analog signal and the second analog signal, compares a signal selected from a group consisting of the first analog signal and the second analog signal to a reference voltage and based on the comparison to the reference voltage, determines a digital result representing the function of the first vector and the second vector.

19 Claims, 8 Drawing Sheets

SIGNAL CONVERSION USING AN ANALOG-TO-DIGITAL CONVERTER AND REFERENCE VOLTAGE COMPARISON

BACKGROUND

As the name implies, an Analog-to-Digital Converter (ADC) converts an analog signal into a corresponding digital signal based on a property or properties of the analog signal. In some examples, an ADC is a circuit element that converts the magnitude of the analog signal's voltage or current into a corresponding digital value proportional to the magnitude.

ADCs may be included in a number of circuits. For example, several types of sensors provide measurements as analog signals, and ADCs may be used to convert and digitize analog signals from image sensors, light sensors, microphones, radio-frequency receivers, cellular receivers, temperature sensors, and more. Furthermore, ADCs may be used in analog computing where operations including convolution, filtering, passband/baseband conversion, Fourier transformation, etc., are performed on data in an analog format. In various such examples, the ADCs are used during or after the analog computations to convert the analog signals into their digital counterparts.

BRIEF DESCRIPTION OF THE DRAWINGS

Certain examples are described in the following detailed description with reference to the drawings, of which.

Throughout the drawings, identical reference numbers may designate similar, but not necessarily identical elements.

DETAILED DESCRIPTION OF SPECIFIC EXAMPLES

Figure 1:
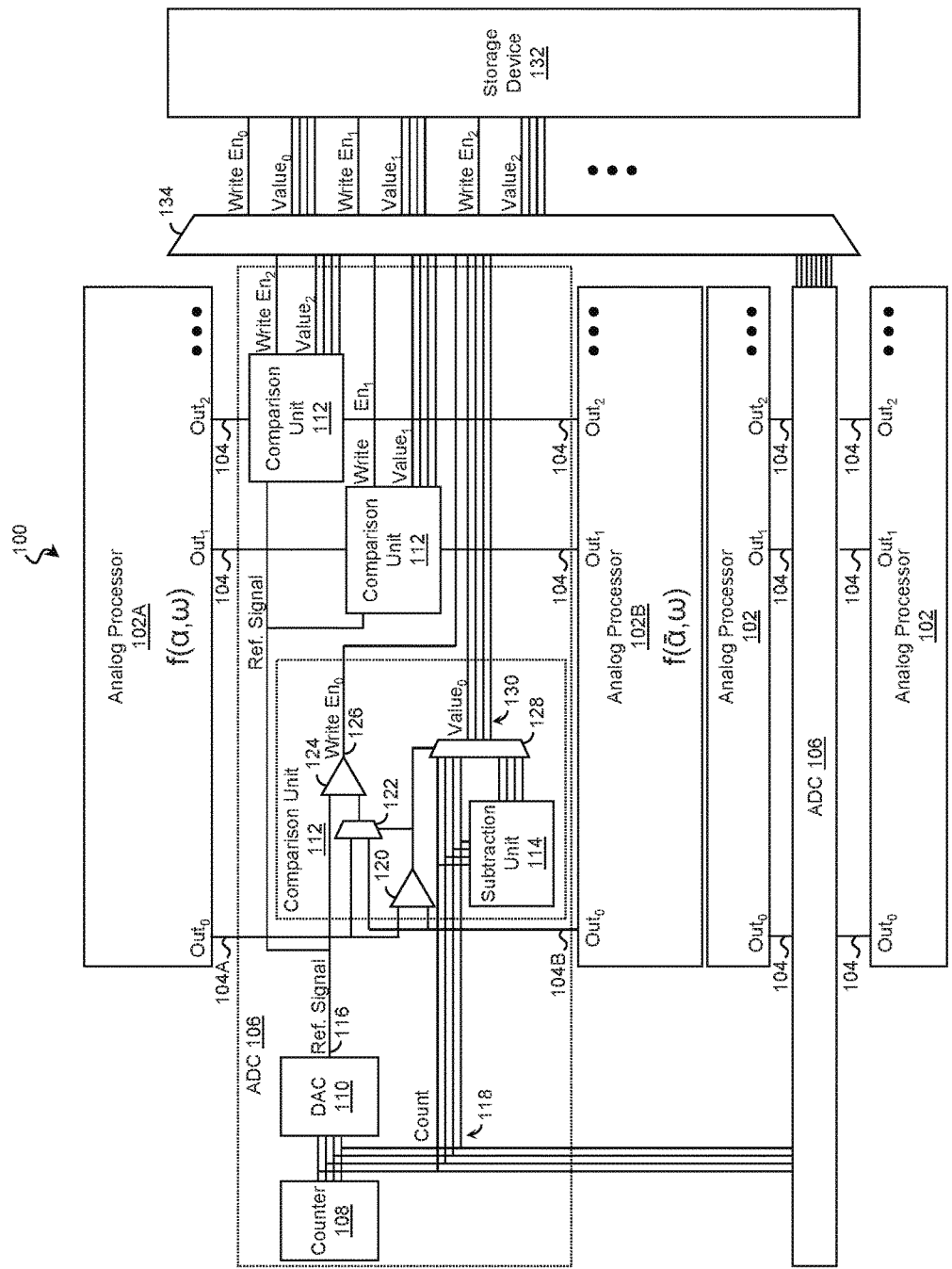
FIG. 1 is a block diagram of a circuit according to some examples of the present disclosure.

An Analog-to-Digital Converter (ADC) converts voltage, current, frequency, and/or other properties of an analog signal into discrete digital values. ADCs may be used to digitize analog signals in a variety of applications. For example, ADCs may be used with analog processors that perform operations including matrix operations, convolution, filtering, amplification, passband/baseband conversion, Fourier transformation, and/or other operations on data in an analog form. At any time during or after the operations, an ADC may be used to convert an analog signal involved in the operation into its digital counterpart.

The ADC may have a resolution or range of digital values that it can distinguish, and the particular resolution of an ADC may be selected based on the application. An ADC may determine a digital value for an analog signal by testing possible values within the ADC's resolution range, generating a reference signal for the value being tested, and comparing the reference signal to the analog signal. In some examples, the ADC operates on complimentary pairs of analog signals to determine the digital value without comparing each possible value in the range.

In more detail, the ADC may be used to determine a digital value of an analog signal that represents a function of two vectors. The analog signal may have a complimentary signal that represents the same function but performed using the binary inverse of the first vector. As described in detail below, the complementary signals may fall on opposite halves of the range of possible values. By performing comparisons using both of the signals, the ADC may determine the digital value of the first analog signal by comparing only half of the range the possible values. This may markedly improve the determination rate of the ADC.

In some examples, a circuit includes a plurality of multi-input ADCs operating in parallel, such as a first multi-input ADC to convert a first set of analog signals and a second multi-input ADC to convert a second set of analog signals. As the analog signals may be available at different times, the first ADC may operate on the first set of signals when the second set is not yet ready. In some examples, this allows the ADCs to share a storage device. The digital values of the first set of analog signals may be stored and retrieved from the storage device while the second set of analog signals are being generated and vice versa. Sharing the storage device between ADCs may reduce the physical size of the storage device while maintaining or even increasing the throughput of the circuit.

The storage device may have any suitable structure, and in some examples, the storage device includes a plurality of memory cells. Each memory cell includes a capacitor for storing a value coupled to a number of pass transistors to control when the value is stored. Such examples provide a storage device with a small footprint and high data rate.

The present disclosure provides substantial real-world improvements to ADC circuits. For instance, in some examples, an ADC operates on a complimentary pair of analog signals to reduce the number of comparisons and thereby increase the conversion rate. In some examples, ADCs share a storage device to reduce the circuit area allocated to storage. It is appreciated that these are merely some of the improvements that the examples described herein may provide.

These examples and others are described with reference to the following figures. Unless noted otherwise, the figures and their accompanying description are non-limiting, and no element is characteristic of any particular example. In that regard, features from one example may be freely incorporated into other examples without departing from the spirit and scope of the disclosure.

FIG. 1 is a block diagram of a circuit 100 according to some examples of the present disclosure. The circuit 100 includes any number of analog processors 102 (including analog processors 102A and 102B), of which four are shown. Suitable analog processors 102 include dot product engines that perform dot products and other matrix operations on matrix and vector values. Other suitable analog processors 102 include receiver circuitry for receiving and processing an analog signal from a sensor such as an image sensor, a light sensor, a microphone, a radio-frequency receiver, a cellular receiver, a temperature sensor, and/or other suitable sensor.

The analog processors 102 receive, operate on, and provide analog signals where some property of the signals, such as voltage, current, frequency, and/or other properties, encode and represent a value. For brevity, in the following examples, the values are encoded in the voltages of the analog signals, although in other examples, any other suitable property and/or combination of properties may be used. In some such examples, the voltage of the analog signal 104 that encodes the value is bounded within a range, and each discrete interval in the range corresponds to a respective digital value.

The analog processors 102 provide any number of analog signals 104, a subset of which of are illustrated, to analog-to-digital converters (ADCs) 106 of the circuit 100 to convert to digital values. The ADCs 106 may include any suitable components such as a counter 108, a digital-to-analog converter 110, a comparison unit 112, a subtraction unit 114, and/or other circuit elements, described in more detail below. Any of the elements of the ADCs 106 including the counter 108 and/or the digital-to-analog converter 110 may be shared among the ADCs 106.

The ADC 106 may compare a data-encoding property (e.g., voltage) of an analog signal 104 to a reference signal 116 to determine whether the properties match. Accordingly, the ADC 106 may include a counter 108 that generates a count signal 118 that counts (e.g., increments or decrements) through the possible digital values within the resolution range of the ADC 106. The count signal 118 of the counter 108 may be provided to a digital-to-analog converter 110 that produces an analog reference signal 116 with a reference voltage that corresponds to the current value of the count signal 118. Comparison units 112 of the ADCs 106 receive the reference signal 116 and an analog signal 104 provided by one of the analog processors 102 and compare the voltages thereof to determine whether the two signals match.

In some examples, the count 118 counts through the entire resolution range of the ADC 106 to check the analog signals 104 against each possible reference voltage. However, the same determination may be made with significantly fewer iterations by leveraging the operation of the analog processors 102. In some examples, a first analog processor 102A performs an operation such as the dot product of two vectors, $\alpha$ and $\omega$, represented as $\alpha \cdot \omega$. The dot product may be part of a dot product of matrices or standalone vectors and may be represented as the sum of the products of the elements:

$$\alpha \cdot \omega = \sum_{i=1}^{n} \alpha_i \omega_i = \sum \alpha_i \omega_i$$

where n is the number of elements in each vector.

When the digital range of the analog processor 102 and of the ADC 106 correspond, a binary inverse ($\overline{\alpha}$) of vector $\alpha$ exists according to the relationship:

$$\overline{\alpha}_i = U_B - \alpha_i$$

where $U_B$ represents the upper bound on the resolution range of the ADC 106. The result of the dot product operation a w and the result of the dot product operation $\overline{\alpha} \cdot \omega$ fall on opposite halves of the range. For example, if $\alpha \cdot \omega$ is within the upper half of the ADC's 106 range, $\overline{\alpha} \cdot \omega$ will be within the lower half of the range, and vice versa. Other operations on vectors $\alpha$ and $\omega$ and on vectors $\overline{\alpha}$ and w may exhibit similar behavior.

Accordingly, in some examples, the first analog processor 102A provides the comparison units 112 with a first analog signal 104A that is a function of vectors $\alpha$ and $\omega$, such as $\alpha \cdot \omega$, while a second analog processor 102B provides a second analog signal 104B that is a function of vectors $\alpha$ and $\omega$, such as $\overline{\alpha} \cdot \omega$. It is noted that both processors, analog processor 102A and analog processors 102B, are used together to determine the result that involves vector $\alpha$, while the complementary vector $\overline{\alpha}$ is used to reduce the number of comparisons.

Continuing the example, the count signal 118 increments through half of the digital range of the ADC 106 (e.g., the lower half or the upper half) to check the analog signals 104 of dot product $\alpha \cdot \omega$ and dot product $\overline{\alpha} \cdot \omega$ against a set of possible reference voltages. Because the results of the operations on vector $\alpha$ and vector $\overline{\alpha}$ fall on opposite halves of the range, the comparison unit 112 will detect one signal of each complementary pair of analog signals 104 that holds a value less than half of the max voltage, hence might match against the reference voltage even though only half of the possible digital range is compared.

Each comparison unit 112 may include any suitable hardware and/or software, and in some examples, a comparison unit 112 includes a first comparator 120 that compares the voltage of the first analog signal 104A that is a function of $\alpha$ and $\omega$ with the second analog signal 104B that is complementary and is a function of $\overline{\alpha}$ and $\omega$. The first comparator 120 compares the two input signals and provides an output that drives a switch 122, such as a multiplexer, signal switch, or other suitable switch, to select the analog signal 104 of the pair that falls within the half of the range being compared. For example, where the counter 108 increments through the lower half of the range, the comparator 120 may drive the switch 122 to select the lesser of the two analog signals 104. Conversely, where the counter 108 increments through the upper half of the range, the comparator 120 may drive the switch 122 to select the greater of the two analog signals 104. The switch 122 provides the selected analog signal to a second comparator 124 that compares the selected signal to the reference signal 116 provided by the digital-to-analog converter 110. In various examples, the second comparator 124 provides a write enable signal 126 that is one if the reference voltage is greater than or equal to the voltage of the selected analog signal 104 and zero otherwise, or vice versa.

The value of the count 118 when the write enable 126 changes state (e.g., transitions from zero to one or vice versa) represents the digital value that corresponds to the selected signal. When the selected signal is the first analog signal 104A that is a function of $\alpha$ and $\omega$, the value of the count 118 represents the digital result of the function. Conversely, when the selected signal is the second analog signal 104B, the value of the count 118 represents the result of the function of $\overline{\alpha}$ and $\omega$. To obtain the value of the original operation that involved vector $\alpha$, the comparison unit 112 includes a subtraction unit 114 to reverse the binary inversion.

Because:

$$\alpha_i = U_B - \overline{\alpha}_i$$

it follows that:

$$\alpha \cdot \omega = U_B \Sigma \omega_i - \overline{\alpha} \cdot \omega$$

In the example of a dot product, when the second analog signal 104B matches the reference voltage, the count 118 represents the result of $\bar{\alpha}\cdot\omega$, and the subtraction unit 114 may subtract the count 118 from $U_B\Sigma\omega_i$ to provide a corrected digital value that represents $\alpha\cdot\omega$. The first comparator 120 that selects the analog signal 104 to be compared may also drive a second switch 128 to select between the count 118 and the corrected digital value provided by the subtraction unit 114 depending on which analog signal 104 is selected and compared. In this way, the second switch 128 provides a set of digital value signals 130 representing the result of the function of $\alpha$ and $\omega$. The second switch 128 provides the set of digital value signals 130 to a storage device 132 of the circuit 100 to be stored.

In many examples, the increase in circuitry of the additional analog processor 102, the corresponding comparison units 112, and the subtraction units 114 used to reduce the number of comparisons is justified by the increased ADC rate because fewer comparisons are made.

In these examples and others, the capacity of the storage device 132 may be reduced by using the storage device 132 to store results from different ADCs 106 at different times. In the illustrated example, a plurality of ADCs 106 are coupled to the storage device 132 by an ADC select switch 134 that selects which ADC's outputs are provided to the storage device 132. In some examples, a first ADC 106 operates on the outputs of a first set of analog processors 102 (e.g., processors 102A and 102B) while a second set of analog processors 102 is loaded with values and begins calculating the respective results. Accordingly, the ADC select switch 134 provides the outputs of the ADC 106 associated with the first set of analog processors 102 to the storage device 132 for storing while the second set of analog processors 102 is being loaded, and vice versa. This allows the ADCs 106 and the storage device 132 to operate in parallel with the analog processors 102. This may improve the computational throughput of the circuit 100 while reducing the area of the storage device 132.

Figure 2:
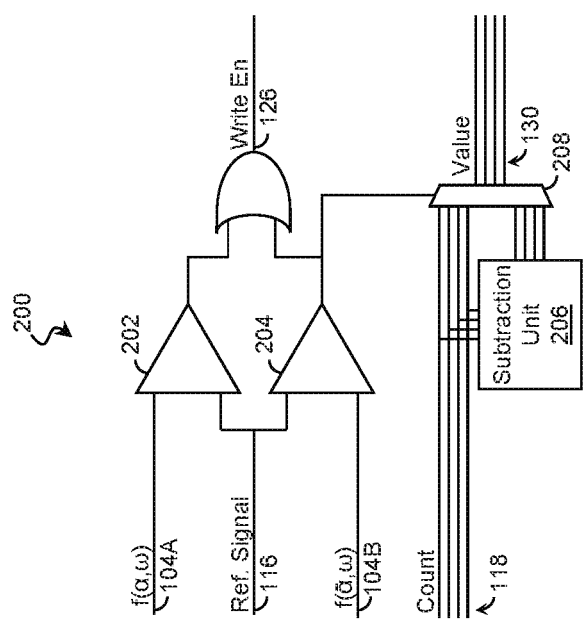
FIG. 2 is a block diagram of a comparison unit according to some examples of the present disclosure.

FIG. 2 is a block diagram of a comparison unit 200 according to some examples of the present disclosure. The comparison unit 200 may be used in the circuit 100 in addition to or as a substitute for the comparison unit 112 of FIG. 1, and may operate similar to the comparison unit 112 of FIG. 1 in many aspects. It is appreciated that the comparison unit 200 (and comparison unit 112) may be either low or high resolution units.

For example, the comparison unit 200 of FIG. 2 receives a first analog signal 104A that is a function of vectors $\alpha$ and $\omega$ and a second analog signal 104B that is a function of vectors $\bar{\alpha}$ and $\omega$. The comparison unit 200 also receives a count 118 that steps through a portion of a resolution range and an analog reference signal 116 with a property, such as voltage, that corresponds to the current value of the count 118.

The comparison unit 200 includes a first comparator 202 that compares the first analog signal 104A to the reference signal 116 and a second comparator 204 that compares the second analog signal 104B to the reference signal 116. The outputs of the first comparator 202 and the second comparator 204 may be OR'ed or otherwise combined to produce a write enable signal 126 that is asserted if either analog signal matches the reference signal 116.

When the first analog signal 104A, which is a function of $\alpha$ and $\omega$, matches the reference signal 116, the value of the count 118 represents the digital result of the function of $\alpha$ and $\omega$. Conversely, when the second analog signal 104B matches the reference signal 116, the value of the count 118 represents the result of the function of $\bar{\alpha}$ and $\omega$, not $\alpha$. To obtain the value of the original operation that involved vector $\alpha$, the comparison unit 112 includes a subtraction unit 206 to reverse the binary inversion. The subtraction unit 206 may be substantially similar to the subtraction unit 114 of FIG. 1. In some examples, the subtraction unit 206 reverses the inversion by subtracting the count 118 from $U_B\Sigma\omega_i$, where $U_B$ represents the upper bound on the resolution range, to provide a corrected digital value.

The second comparator 204 that compares the second analog signal 104B may also drive a switch 208 to select between the count 118 and the corrected digital value provided by the subtraction unit 114 depending on whether it is the second analog signal 104B that matches the reference signal 116. In this way, the switch 208 provides a set of digital value signals 130 representing the result of the function of $\alpha$ and $\omega$.

Figure 3:
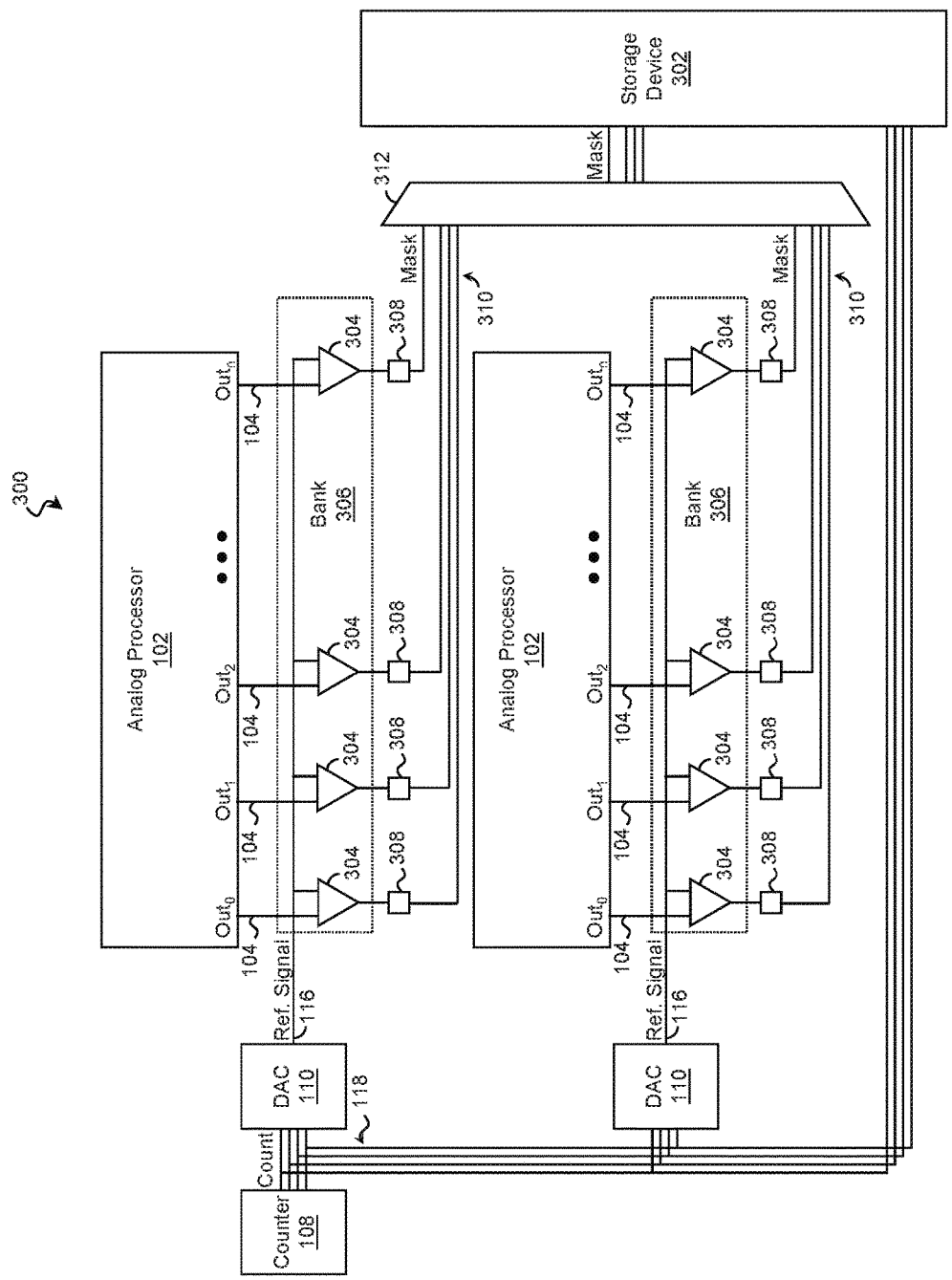
FIG. 3 is a block diagram of a circuit with a shared storage device according to some examples of the present disclosure.

Further examples of a shared storage device are described with reference to FIG. 3. In that regard, FIG. 3 is a block diagram of a circuit 300 with a shared storage device 302 according to some examples of the present disclosure. The circuit 300 includes any number of analog processors 102, each of which may be substantially as described above. The analog processors 102 provide any number of analog signals 104, a subset of which of are illustrated, to any number of comparators 304. In the illustrated example, the comparators 304 are arranged in banks 306 with one comparator 304 per analog signal 104 and one bank 306 per analog processor 102.

The circuit 300 includes a counter 108 coupled to digital-to-analog converters 110. The counter 108 steps a count signal 118 through digital values within a resolution range, and the digital-to-analog converters 110 produce analog reference signals 116 with a reference voltage or other property that corresponds to the current value of the count 118. The analog reference signals 116 are provided to the comparators 304 for comparison with their respective analog signal 104 from the analog processors 102.

In various examples, each comparator 304 provides an output that is one if the reference voltage is greater than or equal to the analog signal voltage and zero otherwise, or vice versa. The outputs of the comparators 304 in a bank 306 are latched by a set of latches 308 and then grouped to form a write enable mask 310. The mask 310 may be provided to the storage device 302 for use as an enable mask. In that regard, each bit of the selected mask 310 may control whether the storage device 302 stores the current count 118 value as the digital value of the analog signal 104 to which the mask bit corresponds. In some examples, the storage device 302 is edge sensitive and captures the current count value when the respective mask bit changes state (e.g., transitions from zero to one or vice versa).

In the illustrated example, the circuit 300 includes an ADC select switch 312 to select which mask 310 is provided to the storage device 302. In some examples, the circuit 300 performs an analog-to-digital conversion of a first analog processor 102, while a second analog processor 102 is loaded with values and begins operating on the values. Accordingly, the ADC select switch 312 may provide the mask 310 associated with the first analog processor 102 to the storage device 302 for storing while the second analog processor 102 is being loaded, and vice versa. This may improve the computational throughput of the circuit 300 while reducing the area of the storage device 302 because the storage device 302 is shared between the sets of analog processors 102.

Figure 4:
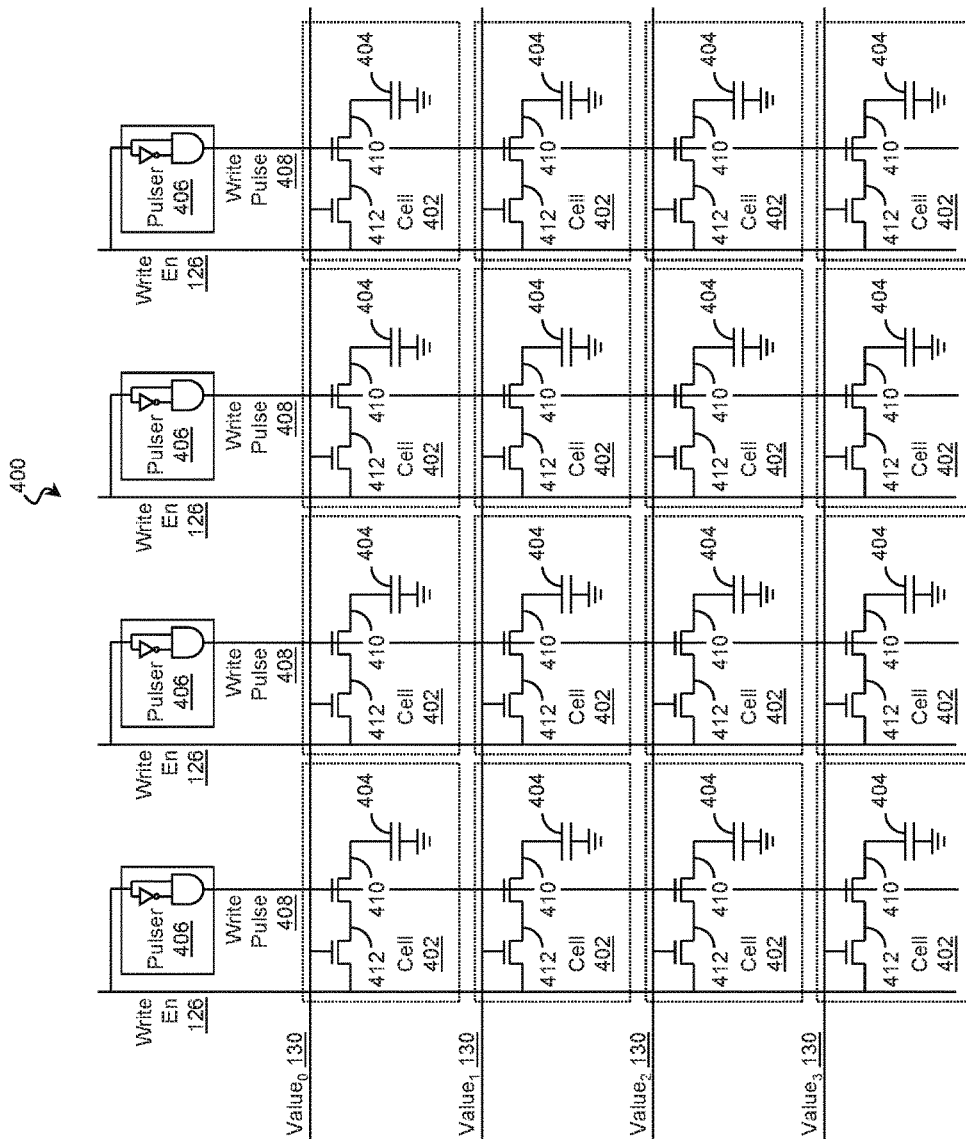
FIG. 4 is a block diagram of a storage device according to some examples of the present disclosure.

Examples of a suitable storage device for use with the circuit 100 of FIG. 1 and the circuit 300 of FIG. 3 are described with reference to FIG. 4, which is a block diagram of a storage device 400 according to some examples of the present disclosure.

The storage device 400 includes a plurality of memory cells 402 to store a digital values representing the results of the analog processors 102 such as those produced by the ADCs 106. Each memory cell 402 may include any suitable programmable element, and in various examples, the memory cells 402 include Dynamic Random Access Memory (DRAM) elements, Static RAM (SRAM) elements, memristive elements, non-volatile memory elements, flash and/or other solid-state memory elements, magnetic memory elements, etc. While the illustrated storage device 400 includes a limited number of memory cells 402, in other examples, the storage device 400 may include any number of memory cells 402.

Each memory cell 402 includes a programmable element such as a capacitor 404. The capacitor 404 may store a charge, and a magnitude or presence of the charge may represent a bit of a digital value. The programmable element of the memory cell 402 may be written to when a respective write enable signal 126 is asserted. The write enable signals 126 may be generated by the comparison unit 112 of FIG. 1, the comparison unit 200 of FIG. 2, the comparators 304 of FIG. 3, and/or any other suitable circuit device.

In some examples, a write enable signal 126 transitions from zero to one, or vice versa, when the respective memory cells 402 are to be written. Accordingly, the storage device includes a pulser 406 that receives the write enable signal 126 and produces a write pulse signal 408 that is asserted when a transition is detected in the respective write enable signal 126. The write pulse signal 408 is provided to the gate of a first transistor 410 that is coupled to the capacitor 404. The first transistor 410 is coupled in series with a second transistor 412 such that the write enable signal 126 applies a charge to the capacitor 404 when both transistors are active. The gate of the second transistor 412 is coupled to the bit of the data value 130 to be stored in the capacitor 404. In this way, the capacitor 404 stores a charge when the write enable signal 126 is asserted, the write pulse signal 408 is asserted, and the respective bit of the data value 130 to be stored is asserted.

Figure 5:
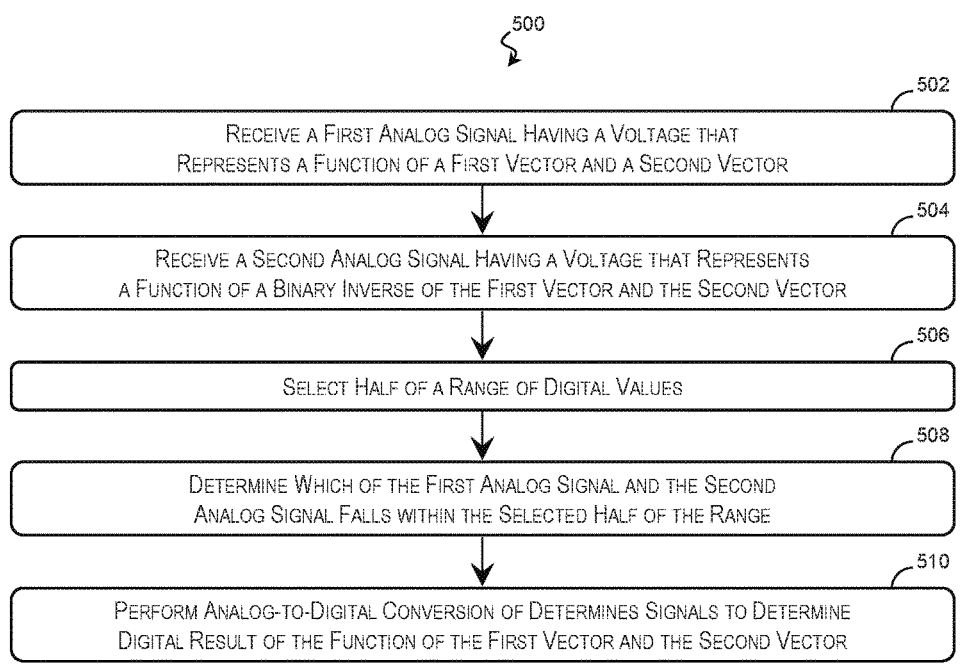
FIG. 5 is a flow diagram of a method of performing an analog-to-digital conversion of a signal according to some examples of the present disclosure.

Examples of performing an analog-to-digital conversion using circuit 100 and/or circuit 300 are described with reference to FIG. 5, which is a flow diagram of a method 500 of performing an analog-to-digital conversion of a signal according to some examples of the present disclosure. The description of the method 500 is non-limiting, and steps may be added to and omitted from the method 500 without departing from the disclosure. Furthermore, unless noted otherwise, processes of the method 500 may be performed in any order including being performed concurrently by one or more entities.

Referring to block 502, a first analog signal 104A is received that has a voltage or other property representing a function of a first vector and a second vector. A digital value that corresponds to the voltage of the first analog signal 104A falls within a range, such as the resolution range of an ADC 106. Referring to block 504, a second analog signal 104B is received that has a voltage or other property representing a function of a binary inverse of the first vector and the second vector. A digital value that corresponds to the voltage of the second analog signal 104B also falls within the range.

Referring to block 506, a half of the range (e.g., a lower half or an upper half) is selected. Referring to block 508, it is determined which of the first and second analog signals 104 falls within the selected half of the range. Referring to block 510, an analog-to-digital conversion of the determined signal is performed to determine a digital result that represents the function of the first vector and the second vector.

Figure 6:
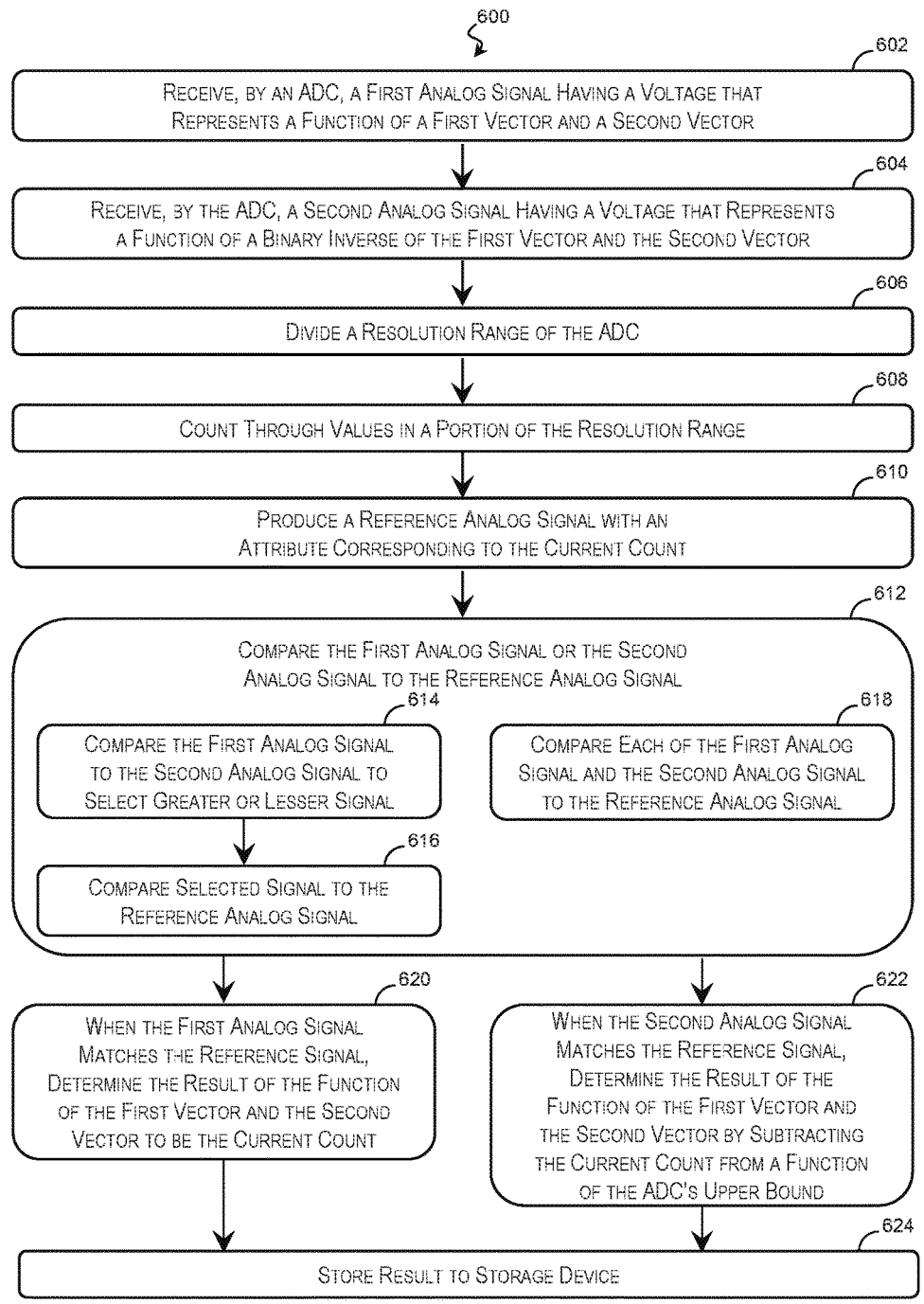
FIG. 6 is a flow diagram of a method of performing an analog-to-digital conversion of an analog data signal according to some examples of the present disclosure.

Further examples of performing an analog-to-digital conversion using circuit 100 and/or circuit 300 are described with reference to FIG. 6. In that regard, FIG. 6 is a flow diagram of a method 600 of performing an analog-to-digital conversion of an analog data signal according to some examples of the present disclosure. The description of the method 600 is non-limiting, and steps may be added to and omitted from the method 600 without departing from the disclosure. Furthermore, unless noted otherwise, processes of the method 600 may be performed in any order including being performed concurrently by one or more entities.

Referring to block 602, an ADC 106 receives a first analog signal 104A that has a voltage or other suitable property representing a function of a first vector and a second vector. The voltage of the first analog signal 104A corresponds to a digital value that falls within a resolution range of the ADC 106. This may be performed substantially as described in block 502 of FIG. 5. Referring to block 604 of FIG. 6, the ADC 106 receives a second analog signal 104B that has a voltage or other suitable property representing a function of a binary inverse of the first vector and the second vector. The voltage of the first analog signal 104A corresponds to another digital value that falls within the resolution range of the ADC 106. This may be performed substantially as described in block 504 of FIG. 5.

Referring to block 606 of FIG. 6, the resolution range of the ADC 106 is divided and one of the portions is selected. In some examples, the range is halved and the upper or lower half is selected. This may be performed substantially as described in block 506 of FIG. 5.

Referring to block 608 of FIG. 6, a counter 108 of the ADC 106 counts through the digital values within the selected portion, and referring to block 610, a digital-to-analog converter 110 of the ADC 106 produces a reference analog signal 104 with a voltage corresponding to the current count.

Referring to block 612 of FIG. 6, the ADC 106 compares the first analog signal 104A and/or the second analog signal 104B to the reference analog signal 104 to determine whether the current count and the digital value associated with the respective signal match. In some examples, this includes comparing the first analog signal 104A to the second analog signal 104B and selecting the signal with the greater or lesser voltage as illustrated by block 614. A comparator 124 compares the selected signal to the reference signal as illustrated by block 616. In some examples, the comparison of block 612 includes comparing each of the first analog signal 104A and the second analog signal 104B to the reference signal 116 as illustrated by block 618.

When the first analog signal 104A matches the reference signal 116, the ADC 106 determines the result of the function of the first vector and the second vector to be the current value of the counter 108 as illustrated by block 620. In contrast, when the second analog signal 104B matches the reference signal 116, the ADC 106 determines the result of the function of the first vector and the second vector to be the current value of the counter 108 subtracted from a function of the upper bound of the ADC's 106 resolution range as illustrated by block 622.

Referring to block 624, the digital result determined in block 620 and/or 622 is stored to a storage device.

Figure 7:
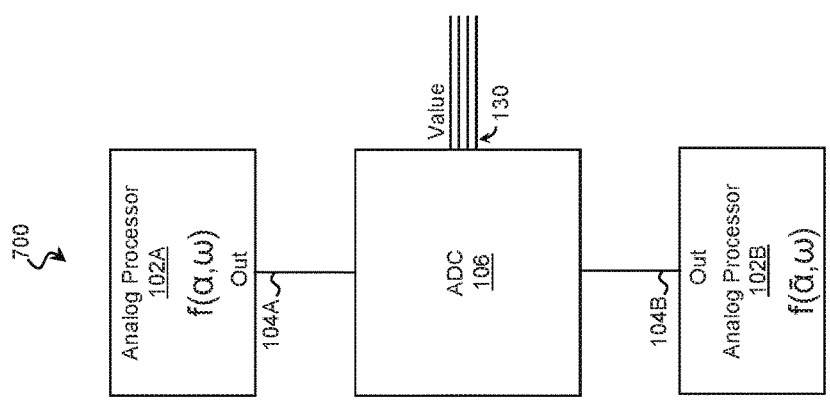
FIG. 7 is a block diagram of an analog processing circuit according to examples of the present disclosure.

Further examples of a circuit for performing the processes of method 500 and/or method 600 are described with reference to FIG. 7. In that regard, FIG. 7 is a block diagram of an analog processing circuit 700 according to examples of the present disclosure.

The analog processing circuit 700 includes a plurality of analog processors 102 each substantially similar to those disclosed in the context of FIGS. 1 and 3. For example, the analog processing circuit 700 may include a first analog processor 102A that performs a function such as a dot product on a pair of vectors, α and ω, and provides a first analog signal 104A having a voltage representing the result of the function of the first vector and the second vector.

The analog processing circuit 700 may include a second analog processor 102B that is complimentary to the first and that performs a function such as a dot product on the binary inverse of the first vector and the second vector, $\bar{\alpha}$ and ω. The second analog processor 102B provides a second analog signal 104B having a voltage representing the result of the function of the binary inverse of the first vector and the second vector.

The circuit 700 includes an analog-to-digital converter 106 coupled to the first analog processor 102A and the second analog processor 102B to receive the first analog signal 104A and the second analog signal 104B. The ADC 106 compares a signal selected from a group consisting of the first analog signal 104A and the second analog signal 104B to a reference voltage. In some examples, the ADC 106 compares the first analog signal 104A and the second analog signal 104B to each other to select a lesser or a greater signal, and compares the selected signal to the reference voltage. In some examples, the ADC 106 compares both analog signals to the reference voltage and detects whether either match the reference voltage. Based on the comparison, the ADC 106 determines a set of digital value signals 130 that represent a digital result of the first vector and the second vector.

Figure 8:
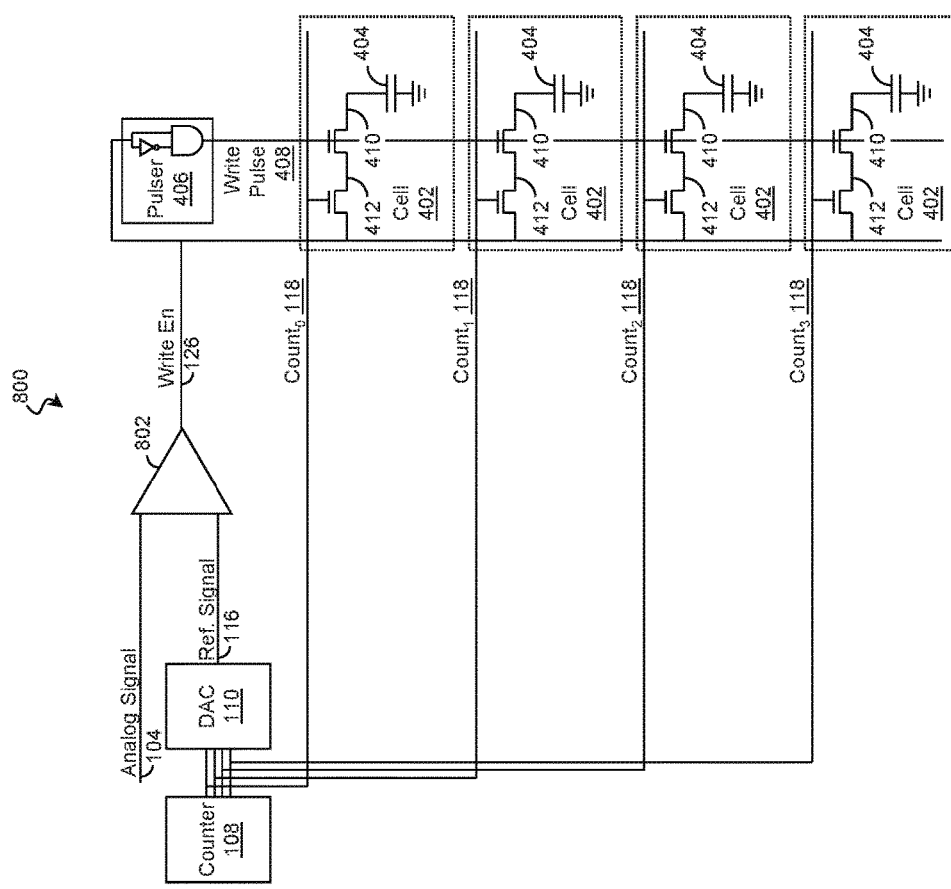
FIG. 8 is a block diagram of an analog-to-digital conversion circuit according to examples of the present disclosure.

Yet further examples of a circuit for performing the processes of method 500 and/or method 600 are described with reference to FIG. 8. In that regard, FIG. 8 is a block diagram of an analog-to-digital conversion circuit 800 according to examples of the present disclosure. The circuit 800 includes a counter 108, a digital-to-analog converter 110, a pulser 406, and a plurality of memory cells 402, each substantially as described above.

The counter 108 provides a count 118 that steps (e.g., increments or decrements) through the possible digital values within a resolution range of the circuit 800. A digital-to-analog converter 110 is coupled to the counter 108 and receives the count 118. The digital-to-analog converter 110 produces an analog reference signal 116 with a reference voltage that corresponds to the current value of the count signal 118.

The circuit 800 includes a comparator 802 to compare the reference voltage of analog reference signal to a received analog signal. As a result of the comparison, the comparator 802 provides a write enable signal 126. In some examples, the write enable signal 126 is zero if the reference voltage is less than the voltage of the analog signal and one if the reference voltage is the same as the voltage of the analog signal or greater, or vice versa.

The comparator 802 is coupled to a pulser 406 that receives the write enable signal 126. The pulser 406 detects a transition in in the write enable signal 126 and produces a write pulse signal 408 that is triggered by the transition.

The circuit 800 includes a plurality of memory cells 402 to receive the write pulse signal 408 and store a respective portion of the count 118 in response to the write pulse signal 408.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A circuit comprising:
a first analog processor to provide a first analog signal having a voltage representing a function of a first vector and a second vector;
a second analog processor to provide a second analog signal having a voltage representing a function of a binary inverse of the first vector and the second vector; and
an analog-to-digital converter coupled to the first analog processor and the second analog processor to:
receive the first analog signal and the second analog signal;
compare a signal selected from a group consisting of the first analog signal and the second analog signal to a reference voltage; and
based on the comparison to the reference voltage, determine a digital result representing the function of the first vector and the second vector.

2. The circuit of claim 1, wherein the analog-to-digital converter is to, when the second analog signal is the selected signal, determine the digital result based on a subtraction of a digital value corresponding to the voltage of the second analog signal from a function of an upper resolution bound of the analog-to-digital converter.

3. The circuit of claim 1, wherein the analog-to-digital converter includes:
a first comparator to compare the voltage of the first analog signal to the voltage of the second analog signal to determine a lesser of the first analog signal and the second analog signal;
a switch coupled to the first comparator to select the lesser of the first analog signal and the second analog signal in response to the first comparator; and
a second comparator coupled to the switch to compare the lesser of the first analog signal and the second analog signal to the reference voltage.

4. The circuit of claim 1, wherein the analog-to-digital converter includes:
a first comparator to compare the voltage of the first analog signal to the voltage of the second analog signal to determine a greater of the first analog signal and the second analog signal;
a switch coupled to the first comparator to select the greater of the first analog signal and the second analog signal in response to the first comparator; and
a second comparator coupled to the switch to compare the greater of the first analog signal and the second analog signal to the reference voltage.

5. The circuit of claim 1, wherein the analog-to-digital converter is a first analog-to-digital converter, and wherein the digital result is a first digital result, the circuit comprising:
a second analog-to-digital converter to determine a second digital result representing a function of a third vector and a fourth vector;

a storage device; and a switch coupled to select between the first analog-to-digital converter and the second analog-to-digital converter to provide a result from a group consisting of the first digital result and the second digital result to the storage device.

6. The circuit of claim 1 comprising a storage device for storing the digital result, wherein the storage device includes:

a pulser to detect a transition of an enable signal produced by the comparison of the selected signal to the reference voltage; and a plurality of memory cells each including a capacitor coupled to store a respective portion of the digital result in response to the detected edge.

7. The circuit of claim 6, wherein each cell of the plurality of memory cells includes:

a first access transistor coupled to the respective capacitor and having a gate coupled to the pulser; and a second access transistor coupled in series with the first access transistor and having a gate coupled to receive the respective portion of the digital result to be stored.

8. The circuit of claim 1, wherein the function of the first vector and the second vector is within a resolution range of the analog-to-digital converter;

wherein the function of the binary inverse of the first vector and the second vector is within the resolution range; and wherein the analog-to-digital converter includes:
a counter to count over half of the resolution range; and
a digital-to-analog converter coupled to the counter to provide the reference voltage in response to the counter.

9. A circuit comprising:

a counter to provide a count;

a digital-to-analog converter coupled to the counter to provide a reference voltage in response to the count;

a comparator coupled to the digital-to-analog converter to receive an analog signal and to compare the analog signal to the reference voltage to provide a enable signal;

a pulser coupled to the comparator to provide an write pulse signal in response to a transition in the enable signal; and a plurality of memory cells each to:
receive the write pulse signal; and
store a respective portion of the count in response to the write pulse signal, wherein the analog signal is a first analog signal and has a voltage representing a function of a first vector and a second vector, wherein the comparator is to receive a second analog signal having a voltage representing a function of a binary inverse of the first vector and the second vector, and wherein the comparator is to compare the first analog signal and the second analog signal to the reference voltage to provide the enable signal.

10. The circuit of claim 9, wherein each of the plurality of memory cells includes a capacitor to store the respective portion of the count.

11. The circuit of claim 10, wherein each of the plurality of memory cells includes a first transistor coupled to the capacitor and having a gate coupled to receive the write pulse signal.

12. The circuit of claim 11, wherein each of the plurality of memory cells includes a second transistor coupled in series with the first transistor and having a gate coupled to receive the respective portion of the count.

13. The circuit of claim 9, wherein the comparator is a first comparator, the analog signal is a first analog signal, and the enable signal is a first enable signal, the circuit comprising:

a second comparator to receive a second analog signal and to compare it to a second reference voltage to provide a second enable signal; and a switch coupled to select between the first enable signal and the second enable signal to provide a selected enable signal to the pulser and the plurality of memory cells.

14. The circuit of claim 9, wherein the plurality of memory cells are to store the count when the voltage of the first analog signal is less than the voltage of the second analog signal and to store a result of a subtraction of the count from a function of an upper resolution bound when the voltage of the second analog signal is less than the voltage of the first analog signal.

15. A method comprising:

receiving a first analog signal having a voltage representing a function of a first vector and a second vector, wherein a digital value that corresponds to the voltage of the first analog signal falls within a range;

receiving a second analog signal having a voltage representing a function of a binary inverse of the first vector and the second vector, wherein a digital value that corresponds to the voltage of the second analog signal falls within the range;

selecting a half of the range;

determining which signal of the first analog signal and the second analog signal is within the selected half of the voltage range; and performing an analog-to-digital conversion of the determined signal to determine a digital result of the function of the first vector and the second vector.

16. The method of claim 15, wherein the performing of the analog-to-digital conversion includes:

initializing a counter to count over the selected half of the range;

generating a reference voltage in response to a count of the counter; and comparing the determined signal to the reference voltage.

17. The method of claim 15 comprising, when it is determined that the second analog signal is within the selected half of the range, determining the digital result by subtracting the digital value that corresponds to the voltage of the second analog signal from a function of an upper bound of the range.

18. The method of claim 17 comprising, when it is determined that the first analog signal is within the selected half of the range, determining the digital result to be the digital value that corresponds to the voltage of the first analog signal.

19. The method of claim 15, wherein the determining of which signal is within the selected half of the range includes comparing the voltage of the first analog signal to the voltage of the second analog signal.

* * * * *